(12) United States Patent
Niu et al.

(10) Patent No.: US 6,433,878 B1
(45) Date of Patent: Aug. 13, 2002

(54) METHOD AND APPARATUS FOR THE DETERMINATION OF MASK RULES USING SCATTEROMETRY

(75) Inventors: Xinhui Niu, San Jose; Nickhil H. Jakatdar, Fremont, both of CA (US)

(73) Assignee: Timbre Technology, Inc., Fremont, CA (US)

(*) Notice: Subject to any disclaimer, the term of this patent is extended or adjusted under 35 U.S.C. 154(b) by 0 days.

(21) Appl. No.: 09/772,148

(22) Filed: Jan. 29, 2001

(51) Int. Cl.$^7$ ............................................... G01B 11/14
(52) U.S. Cl. ...................... 356/603; 356/394; 356/392; 356/606; 430/30; 430/5
(58) Field of Search ................................ 356/603, 604, 356/606–610, 620, 634–636, 640, 488–489, 392–394; 430/5, 30

(56) References Cited

U.S. PATENT DOCUMENTS

| | | | | |
|---|---|---|---|---|
| 4,870,289 A | * | 9/1989 | Sato et al. | ................... 356/603 |
| 5,164,790 A | | 11/1992 | McNeil et al. | |
| 5,413,884 A | * | 5/1995 | Koch et al. | ..................... 430/5 |
| 5,576,829 A | * | 11/1996 | Shiraishi et al. | ............ 356/488 |
| 5,879,844 A | * | 3/1999 | Yamamoto et al. | ........... 430/30 |
| 5,962,173 A | * | 10/1999 | Leroux et al. | .............. 356/635 |
| 5,963,329 A | | 10/1999 | Conrad et al. | |
| 6,137,570 A | | 10/2000 | Chuang et al. | |
| 6,187,483 B1 | * | 2/2001 | Capodieci et al. | ............. 430/5 |

OTHER PUBLICATIONS

A. R. Neureuther et al., "Numerical Methods for the Analysis of Scattering from Nonplanar Periodic Structures", Intn'l URSI Symposium of Electromagnetic Waves, Stresa Italy, pp. 282–285, 1969.

M. Neviere et al., "Systematic Study of Resonances of Holographic Thin Film Couplers", Optics Communications, vol. 9, No. 1, pp. 48–53, Sep. 1973.

Ch. J. Raymond et al., "Multiparameter grating metrology using optical scatterometry", J. Vac. Sci. Technol. B 15(2) Mar./Apr. 1997, pp. 361–368.

X. Niu, "Specular Spectroscopic Scatterometry in DUV Lithography", Metrol. Inspection and Process Control for Microlithography XIII, vol. 3677, pp. 159–168, 1999.

* cited by examiner

*Primary Examiner*—Frank G. Font
*Assistant Examiner*—Sang H. Nguyen
(74) *Attorney, Agent, or Firm*—Morrison & Foerster LLP

(57) ABSTRACT

A method and apparatus for determining optical mask corrections for photolithography. A plurality of grating patterns is printed onto a wafer utilizing a photomask having at least one grating. Each grating pattern within the plurality of grating patterns is associated with known photolithographic settings. Each grating pattern is illuminated independently with a light source, so that light is diffracted off each grating pattern. The diffracted light is measured utilizing scatterometry techniques to determine measured diffracted values. The measured diffracted values are compared to values in a library to determine a profile match. A 2-dimensional profile description is assigned to each grating pattern based on the profile match. A database is compiled of the profile descriptions for the plurality of grating patterns. Photomask design rules are then generated by accessing the database containing the 2-dimensional profile descriptions. In preferred embodiments, the design rules are used to create and correct masks containing OPC corrections, phase-shifting mask corrections and binary masks. In a preferred embodiment the at least one grating is a bi-periodic grating. In a preferred embodiment, the scatterometry technique is optical digital profilometry utilizing a reflectometer or ellipsometer.

20 Claims, 11 Drawing Sheets

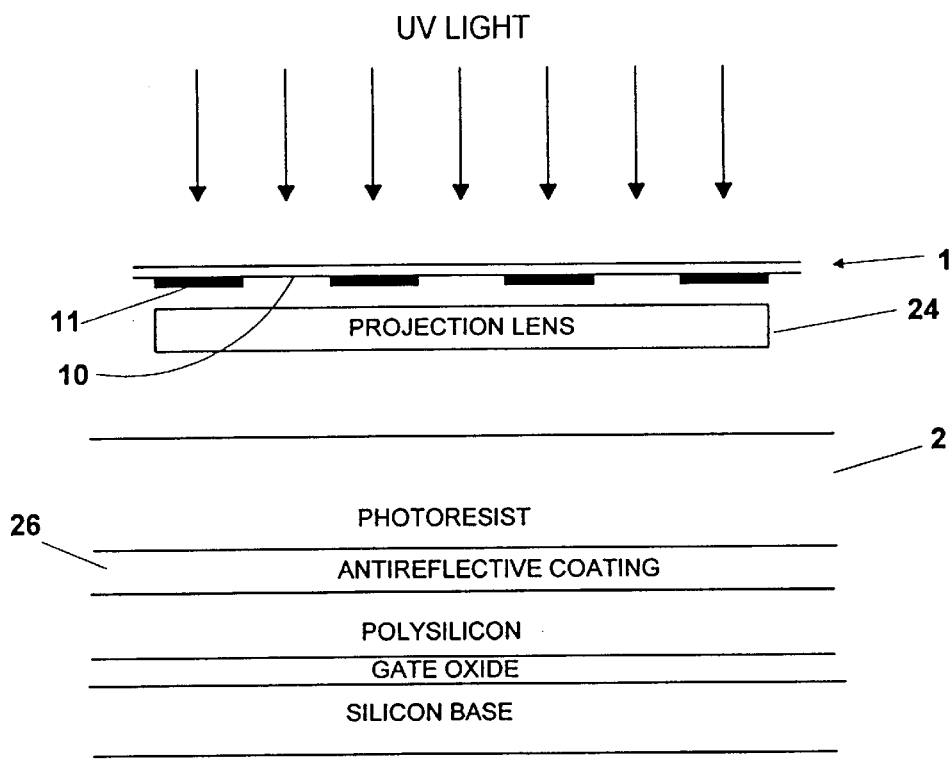
FIG. 1 Prior Art
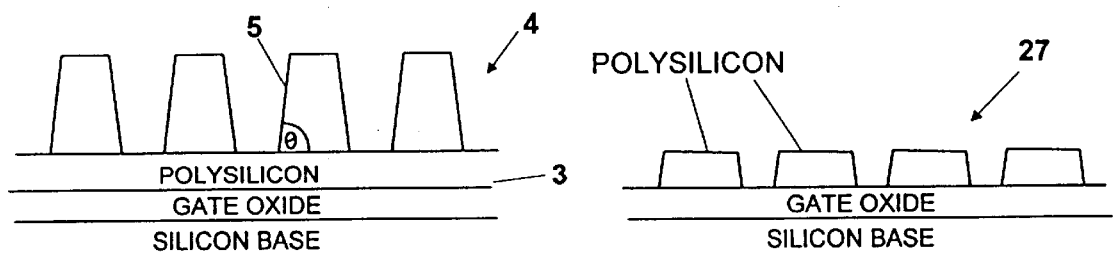
FIG. 2A Prior Art  FIG. 2B Prior Art
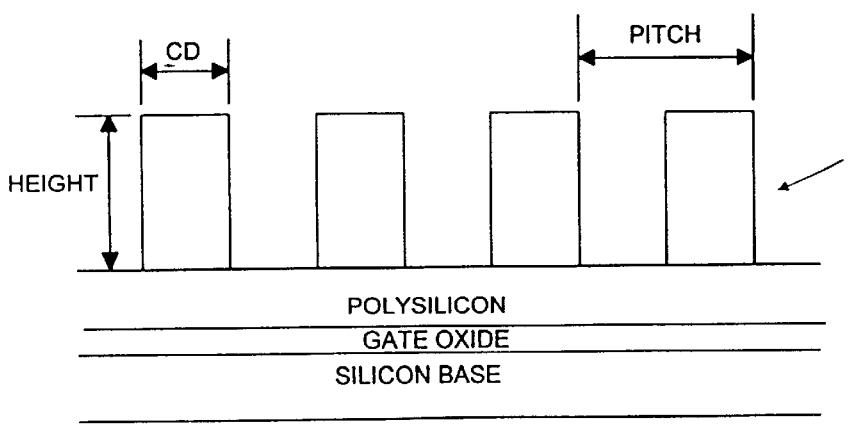
FIG. 3 Prior Art

PHOTORESIST
GATE OXIDE
POLYSILICON
SILICON

UV LIGHT

METHOD AND APPARATUS FOR THE DETERMINATION OF MASK RULES USING SCATTEROMETRY

BACKGROUND OF THE INVENTION

Computer chips or microcircuits are fabricated using a complex sequence of processing steps consisting of many individual pattern processing steps. As the semiconductor industry continues to shrink the microcircuit designs to create faster microcircuits at lower cost, the semiconductor manufacturing methods have become very complex. The pattern processing sequence typically consists of a photolithographic process and a plasma etch process. Photolithography is the process of creating a 3-dimensional image, using a photomask or reticle pattern, onto a suitable recording media such as a photoresist film on top of a semiconductor substrate or silicon wafer. The process is performed using a photolithographic exposure tool such as a stepper or scanner. Today it takes about 25 pattern processing steps or layers to build-up a modern semiconductor microcircuit.

An example of a typical photolithographic exposure sequence for the polysilicon gate layer of a typical semiconductor microprocessor might include the following sequence of events: As shown in FIG. 1, Deep-ultraviolet light is passed through binary (chrome patterned glass) photomask 1 via projection (4×or 5×reduction) lens 24 so that it illuminates a layer of photoresist 2 at the proper de-magnification. After exposure the positive photoresist is sent through the final few steps of the photolithographic process and is developed out to form a 3-dimensional resist pattern on top of an antireflective coating 26. The resulting resist pattern 4 is shown in FIG. 2A. (Antireflective coating layer 26 is only shown in FIG. 1). The final etch pattern 27, after etching and removal of the photoresist, is shown in FIG. 2B.

Semiconductor manufacturers produce high quality and lower cost microcircuits when the lithographic patterns etched into the semiconductor surface meet the intended physical design rule specifications. To meet this goal, each lithographic feature must have the proper critical dimension (CD), sidewall angle θ, and the proper height as determined by the design rules and pattern processing requirements (see FIG. 3) However, most modem lithographic and plasma etch processes—especially those where the width of the CDs on the photomask approaches the size of the exposure wavelength—are very difficult to control in practice. The lithographic and final etch specifications depend on the microcircuit design and the fabrication process and the methods used to control them. As microcircuit patterns become smaller the specifications have become very difficult to meet—thus process yields suffer driving margins lower. Today, researchers are developing new techniques in an attempt to improve the process. Known techniques include wavefront engineering (such as optical proximity correction (OPC) and the use of phase shift mask (PSM)) and the metrology used to measure the performance of these optical enhancements.

Optimizing the Resist and Final Etch Patterns

In very general terms the design engineer, optical scientist, and process engineer are interested in two main characteristics of the lithographic features, the feature size called the critical dimension (CD) and the overall 2-D cross-sectional shape of the resist or etched features. For reasons of yield, device performance and functionality, a process that is capable of producing fine lines at all relevant pitches with the proper 2-D profile is highly desirable. While it may be possible to design a photolithographic and etch process for one particular lithographic feature (for example, 100 nm CD with a 200 nm pitch), in practice one is almost always forced to design photolithographic and etch processes for more complex situations. For example, the photomasks for most polysilicon gate layers usually contain a very complex array of patterned lines of similar CDs with various pitches. It should be noted that isolated features (where the pitch is much greater than the CD) act optically very different as compared to dense features (where the CD is nearly equal to the pitch)—this translates into different lithographic performance. For the same exposure dose, isolated features tend to have smaller CDs as compared to dense features. This asymmetry causes problems. Today, optical scientists are continuously trying to improve the manufacturability of these difficult semiconductor processes by using wavefront engineering techniques, such as OPC and PSM, and complex electromagnetic simulator computer programs to modify the photomask design and improve the quality of the microcircuit.

Mask 1, as shown in FIG. 1, is known as a binary mask in that the patterned area is either clear or opaque. Light from the photolithographic exposure tool diffracts as it passes through the clear regions 10 just prior to being imaged by the projection lens. The opaque regions 11 block the remaining portions of the light source. The creation of this photomask is not a perfect process and the CDs on the photomask are themselves a source of problems for the optical scientist and process engineer. In fact, as the feature size on the photomasks continues to shrink the process sensitivity to photomask error increases. This effect is known as mask error factor and is another area of concern (see for example, "Understanding Mask Error Factor For Sub-.18 um Lithography" ARCH Microlithography Symposium Proceedings Nov. 5–7, 2000). OPC and PSM techniques have been created to address these issues as well.

Finally, as semiconductor manufacturers have continued to decrease the CD, diffraction effects at the mask have made it very difficult to maintain vertical resist patterns (see for example, the book edited by P. Rai-Choudhury *Microlithogra-phy Micromachining and Microfabrication*, SPIE press, 1997). The challenge of semiconductor manufactures has been to create robust processes that can print very small lines with dramatically different pitch characteristics. Here robust process means—a patterning process that can produce the desired CDs and side wall angles (typically>80° degrees) for each feature type over a wide range of process conditions. FIG. 3 shows a resist profile with an ideal side wall angle of approximately 90° degrees. For most processes layers (such as polygate layers, metal layers, contact layers etc.,) the process engineer is typically most concerned with the following process variables: exposure, focus, post exposure bake temperature, post exposure bake time, develop time and resist thickness. In practice these variables are not held constant and change constantly due to systematic and random fluctuations of the processing equipment. For example, a slight change in focus of say 0.1 um may change the CD of a given feature by 5 nm. It therefore is desirable to implement control techniques that produce lithographic processes that are less sensitive to changes in the process variables and create features that act similarly in a lithographic sense.

OPC is a new but fairly well known method of selectively altering the patterns on a mask in order to more exactly obtain the desired printed patterns in the photoresist by modifying the diffracted light pattern (a good discussion of these techniques and examples can be found in the book by P. Rai-Choudhury "Microlithography, Micromachining and Microfabrication" SPIE press, 1997). As shown in FIG. 4, the pattern on mask 15 has been altered by adding OPC lines 16. In addition, OPC techniques have been shown to create more robust lithographic processes (in the sense mentioned above) by creating photomask features that are less sensitive to process variations.

FIG. 5 shows phase-shifting mask 17. Phase-shifting mask 17 is a mask that contains a spatial variation not only in intensity transmittance but phase transmittance as well. Phase-shifting mask 17 has clear regions 18 and 20 that produce a half wave phase shift in the light transmitted through the clear portions of mask 17.

It is also possible to fabricate a mask that combines the features shown in FIGS. 4 and 5. For example, FIG. 6 shows mask 22 that includes both OPC lines 21 and phase-shifting features 23. Thus, with the use of a mask that has optical correction features similar to those shown in FIGS. 4-6, improved resist patterns with tight CD and good shape, similar to that shown in FIG. 3 can be obtained. However, a challenge has been to know when and to what degree OPC corrections and phase-shifting corrections should be utilized when designing a mask.

For example, an optical engineer may want to print pattern 25 (as shown in FIG. 7) into a layer of photoresist—it consists of one fairly isolated group of features and one dense group of features. The designer realizes that using his existing photolithographic process he cannot print the two lines at the same time (for the same exposure conditions his dense lines print larger than his isolated lines). So, in order to design a photomask that results in the pattern shown in FIG. 7, the photomask should possibly include some optical proximity corrections of the type shown in FIG. 8. There are currently several companies or vendors marketing OPC technology such as; ASML MaskTools, Inc., SigmaCad, Inc. and Numerical Technologies, Inc. These companies offer software (MASKRIGGER, registered trademark of ASML MaskTools), hardware (LINESWEEPER registered trademark of ASML MaskTools Inc.) an-d electromagnetic simulation solutions (SOLID-C registered trademark of SigmaCad) that can be used to generate a set software instructions that automatically adds OPC corrections to any given photomask design depending on the features of that design. Some of the corrections (or rules) that need to be considered are; determining the size of the sub-resolution or assist features, the position of the features, the length of the features, the amount of line biasing that might be needed for each relevant photomask feature and determining which lines actually need correction. Typically, most of these OPC rules are determined using complex lithographic simulation software that can reasonably predict the behavior of any given lithographic process once the lithographic process variables are known (most vendors recommend providing them with the following process parameters; critical dimensions, relevant pitches, focus, exposure, resist type and thickness, temperature, numerical aperture and partial coherence to name a few.) For example, based on these inputs, ASML MaskTools Inc. can use a lithographic computer simulator to generate a starting set of OPC corrections. Even so, most OPC vendors still prefer that a test mask, one that incorporates many different optical corrections be printed on several resist coated semiconductor wafers in order to physically verify the performance of the various OCP corrections under unique processing conditions. Some of these wafers are sent to final etch and some are sent for a destructive cross-section CD SEM measurement to determine which rules are the really best. This is the most time consuming and expensive part of the technique. FIG. 8 shows a typical OPC photomask 73—something that might be produced by using the methods and techniques mentioned- above. OPC mask 73 has lines 72 and OPC lines 74. If used in accordance with the input parameters, OPC mask 73 will result in the proper reproduction of the isolated and dense patterns shown in FIG. 7—each pattern, and resulting profile will be in specification over a very large range in process conditions (before and after etch) as compared to the photomask without OPC corrections.

In order for the techniques mentioned above to work properly a database must be compiled representing a wide variety of input conditions and parameters. This database is acquired by utilizing an OPC test mask or other photomask and collecting digital or other information concerning the cross-sectional shape or profiles of the photoresist and etched features under different sets of processing conditions.

Currently, ASML Masktools Inc. will provide to its customer a test mask called a LINES WEEPER reticle (LINESWEEPER is a registered trademark of ASML MaskTools Inc.) and ask that the customer print a wafer utilizing the test mask. The test mask that is provided to the customer will contain various optical correction features, such as the OPC features and possibly phase-shifting features as described above.

FIG. 9 shows a typical OPC test mask 30. Test pattern area 36 contains an array of various test patterns, such as a serif size and placement test and vertical line spacing test. Each of these test patterns may include OPC rules or phase-shifting mask rules.

FIG. 9 also shows a critical dimensional—scanning electron microscope (CD-SEM) cross-section test area 35. The CD-SEM cross-section test area 35 has five groups 40–44. The groups 40–44 are each separated by approximately 20 microns at wafer level (assuming a 4 x reduction system.) Each group 40–44 has 130 measurement structures 38 for a total of 650 (5×130) measurement structures per die. Each measurement structure 38 has five lines 39 that are each approximately 2.5 mm long when projected onto the wafer (FIG. 10). Measurement structures 38 are separated by approximately 20 microns.

Groups 40–44 have lines 39 that have varying linewidths. For example, lines 39 in group 40 (FIG. 10) have a linewidth of approximately 0.16 microns. Lines 39 in group 41 (FIG. 11) are slightly wider with linewidths or CDs of approximately 0.18 microns. Likewise, the linewidths in group 42 are approximately 0.20 microns, the linewidths in group 43 are approximately 0.22 microns, and the linewidths in group 44 are approximately 0.24 microns.

Within each group 40–44, line 39 separations (i.e., the distance between adjacent lines 39) vary from approximately 0.28 microns to 1.50 microns. As shown in FIGS. 10 and 11, OPC lines 45 are located adjacent to lines 39 at varying distances.

In order to build a set of OPC or PSM rules that allow the customer to create a semiconductor process with a large overlapping process window (i.e., where the isolated and dense features printed within specification over a wide variety of process conditions) test mask 30 (FIG. 9) is printed under a variety of processing conditions. FIG. 12 shows an example in which a customer utilizing test mask 30 has printed a 10×10 Focus Exposure Matrix 52 on photoresist covered 300 mm wafer 50. Within matrix 52 there are 100 print areas 54 that are each approximately 25 mm×25 mm. Within each print area 54, there is a printed test pattern area 56 and a printed cross section area 55. Printed test pattern area 56 corresponds to test pattern area 36 on mask 30 and printed cross section area 55 corresponds to cross-section test area 35 on mask 30.

In the example shown in FIG. 12, for each print area 54 focus increases from left to right and exposure increases from top to bottom. Hence, within matrix 52, there are 100 test cases, each having a unique focus and exposure setting.

As shown in FIGS. 13 and 14A, after wafer 50 has been printed and sent through the fmal few steps of the photo-lithographic process resist lines 60 are left on polysilicon layer 62. FIG. 13 shows a top view of lines 60 and FIG. 14A shows a cross-section view of lines 60 on polysilicon layer 62. Resist lines 60 correspond to lines 39 of mask 30 shown in FIGS. 10 and 11. Likewise, lines 61 etched in polysilicon layer 62 (FIG. 14B) correspond to lines 39 of mask 30 shown in FIGS. 10 and 11 after polysilicon layer 62 has been etched away (except for the portion covered by photoresilst lines 60). Lines 61 are examined with a SEM and cross-section SEM (or Atomic Force Microscope) and the results are recorded.

Compiling the Rules—A Simple Example

After obtaining the results shown in FIG. 14A and FIG. 14B, the results are stored in a computer database so that they are accessible by ASML MaskTools Inc. for final OPC evaluation. For the example shown in FIG. 7, the customer is designing a photomask that requires printing both isolated and dense features in groups of 5 lines to be situated adjacent to each other. The lines have a printed linewidth of 0.25 microns and are separated by 0.30 microns and have a profile that contains lines that are nearly vertical. The customer intends to print his wafer using a focus of 0.20 microns and an exposure setting of 20 mj/cm$^2$. Based on previous simulation results and the cross-sectional data obtained and shown in FIG. 14A and FIG. 14B and based on the customers inputs just described, ASML MaskTools (using MASKRIGGER software and simulation results) can now design and apply the proper set of optical proximity corrections on a given photomask as shown in FIG. 8 with lines 72 and OPC lines 74. Where the term "proper set" refers to the ability of the OPC rule set to produce a photomask that can print lithographic features with the largest overlapping process window.

Problems with the Prior Art

A major problem that exists with the prior art lies in the determination of the linewidth of resist lines 60 (shown in FIG. 13) and the profile of 2-D lines 60 and lines 61 (shown in FIG. 14A and FIG. 14B). Currently, this determination is made by manually observing the profile utilizing a metrology tool such as a Scanning Electron Microscope, Atomic Force Microscope, or Cross-Section CD-SEM. The prior art method of making this determination is extremely expensive, time consuming, and destructive. FIG. 13 shows a top view of a portion of a SEM image and FIGS. 14A 14B each show a SEM cross-section view. As explained above, for each print area 54, there are 5 groups of 130 measurement structures. Each measurement structure has 5 lines. In a typical matrix 52, there are 100 print areas 54. Therefore, there are a total of 325,000 lines in matrix 52 for which SEM analysis needs to be completed (5 groups/print area×130 measurement structures/group×5 lines/measurement structure×100 print areas/matrix). Moreover, to determine a 2-D profile as shown in FIG. 14A and FIG. 14B, it is necessary to fracture the wafer along line 14 (FIG. 13) so that a side view of the cross-section can be obtained. The fracturing of the wafer and the CD-SEM preparation procedure is an extremely delicate process that is also time consuming and expensive.

In addition, because it is desirable to know the 2-dimensional profile and pitch for each OPC test case both before and after etch, at least two wafers need to be printed. For example, after the first wafer is printed, it needs to be fractured to determine the 2-D profile as shown in FIGS. 14A and 14B. The fracturing of the wafer effectively destroys it. Therefore, a second un-fractured wafer needs to be available so that it can be etched to determine the profile of the polysilicon or other features after etch. The problem here is that each wafer has its own unique built-in process variation in that each wafer is processed one at a time. During its processing time, due to system imperfections each wafer sees a slightly different set of process conditions, even though the lithographic settings may be the same. Since OPC rules are generated to reduce the effects of process variation the method requires making various assumptions about the effect of small process variations in determining the best set of OPC rules. It would be better to have a non-destructive cross-sectional profiling method to measure the OPC test features. This way the same wafer could be measured both before and after etch.

Ellipsometry

Ellipsometry is based on the polarization transformation that occurs when a beam of polarized light is reflected from a medium. The transformation consists of two parts; a phase change and an amplitude change. These changes are different for incident radiation with its electric vector oscillating in the plane of incidence (p-component) compared to the electric vector oscillating perpendicular to the plane of incidence (s-component). Ellipsometry measures the results of these two changes that are represented by angle $\Delta$, which is the change in phase of the reflected beam from the incident beam; and an angle $\Psi$, which is defined as the arc tangent of the amplitude ratio of the incident and reflected beam. A microscopic pattern illuminated with polarized light produces unique values of $\Delta$ and $\Psi$ that vary with wavelength. Charts of cos $\Delta$ and tan $\Psi$ as a function of wavelength can be used to compare unknown patterns with known patterns. Examples of such charts are shown in FIGS. 20 and 21.

Scatterometry from Periodic Structures

Scatterometry is well known and refers to a procedure by which a grating profile is reconstructed based on its optical diffraction response.

Conventional Scatterometry

Conventional scatterometry (also called two-theta scatterometry) uses single wavelength light—typically, 632.nm He:Ne laser light at one polarization state (TE or TM) to obtain a scatter-gram of the diffraction grating (our semiconductor gratings). For a detailed description of conventional scatterometry, please see C. Raymond, et. al. J. Vac. Sci. Tech B, vol. 15, no. 2, 361–368, 1997. Also, conventional scatterometry is described in U.S. Pat. Nos. 5,164,790 and 5,867, 276, both which are hereby incorporated by reference. The scatter-gram or diffraction patterns are plots of the intensity of the light vs. scattering angle. Light of a specific wavelength is scattered off gratings in various directions known as orders. Zero-order (or 0-order) light refers to the light reflected at an angle equal to the incident angle. The technique uses a Rigorous Coupled-Wave Analysis (RCWA) to generate a library of optical signals—each corresponding to a particular grating pattern. An optimization routine is then used to match the output signal of the grating in question to the signals stored in the library. RCWA is described in more detail below. Conventional Scatterometry is limited in the sense that as the critical dimension shrinks the grating scatters higher orders (>0 order) at larger angles—eventually, the diffracted signal becomes evanescent—not measurable in the far field. Additionally, compared with the techniques listed below, because just a single wavelength is utilized, the output data set is rather limited. Typically one can argue that more output -data (more wavelengths and more output angles) would lead to more detailed libraries and better or more accurate pattern matching. The creation of such detailed libraries using standard methods of RCWA would take a very long time. This technique is not suited for in-situ applications because the machinery involved is rather complex with many moving parts.

Spectroscopic Reflectance Scatterometry From Periodic Structures

Spectroscopic Reflectance Scatterometry is based on the reconstruction of the grating profile from the optical diffraction response (intensity) over many wavelengths (200 nm–900 nm) at one output angle or 0-order. Spectroscopic Reflectance Scatterometry is described in detail in U.S. Pat. No. 5,963,329 issued to Conrad, which patent is hereby incorporated by reference. Typically some version of RCWA is used to generate the libraries and produce profile results thru optimization routines—however, generally, accurate profile shapes cannot be determined unless account is taken for many diffraction orders in the RCWA calculations. If many orders are not accounted for, it usually means that a library cannot be created that captures the true details of the feature line images. Spectroscopic Reflectance Scatterometry is suited for in-situ applications because it is less complex as compared to conventional scatterometry.

Optical Digital Profilometry For Periodic Structures

Optical Digital Profilometry (ODP), also known as Specular Spectroscopic Scatterometry, is known and is also based on the reconstruction of the grating profile from the optical diffraction response. A detailed description of this technique is given in Xinhui Niu, et. al., "Specular Spectroscopic Scatterometry in DUV Lithography", *Metrology Inspection, and Process Control for Microlithogra hv XIII*. Vol. 3677, pp. 159–168, 1999. In ODP, a conventional spectroscopic ellipsometer to gather tan $\Psi$ and cos $\Delta$ over many wavelengths (see discussion above under "Ellipsometry"). The utilization of a conventional spectroscopic ellipsometer generates more detailed optical data than either conventional scatterometry (one wavelength at a few angles) or spectroscopic reflectance scatterometry (Intensity vs. wavelength). A typical ellipsometer that is used to collect the output signals usually utilizes a broadband Xenon lamp or other source in the 200 nm–900 nm range. For ODP, one uses traditional ellipsometers to collect the 0-order diffraction data. The ODP technique uses a power computer program to build very large and complex pattern libraries. The technique also uses a simulated annealing (optimization) routine to quickly find pattern matches. While each technique mentioned above typically utilizes some version of RCWA analysis to build a scatterometry library—many other mathematical techniques are available to solve grating problems (for example, Neureuther's integral method). The ODP technique makes use of a special, very efficient numerical code generated by X. Niu in his 1999 thesis at UCB "Specular Spectroscopic Scatterometry in DUV Lithography". X. Niu's thesis explains how to solve complex diffraction grating problems using a modified form of RCWA. X. Niu's modified form of RCWA is a significant improvement over the standard method of RCWA mentioned under the heading "Conventional Scatterometry". X. Niu's modified form of RCWA allows one to solve for many orders in very short periods of CPU time. Even though the technique measures the light in one direction (0-order) many orders must be solved for in order to build a high-resolution, high-precision library. The more detailed a library is, the more accurately it can predict the entire 2-D grating profile. Since many of the OPC test designs modify the shape of the final 2-D feature patterns only very slightly it is very desirable to use a sensitive scatterometry technique to quantify the results. Scatterometry techniques that are not sensitive to very small changes in the feature profile are simply not capable of measuring the subtle differences between different OPC test cases. For example, some OPC corrections can change line sizes by 1 nm.

Far Field Scatterometry

Another scatterometry technqiue is disclosed in U.S. Pat. No. 6,137,570, issued to Chuang; Yung-Ho and assigned to KLA-Tencor, Inc., which patent is hereby incorporated by reference. This technique uses a look-up or library technique to determine the qualitative shape of grating patterns or other patterns using a variety of light sources. The problem here is that the library is not robust enough to detect the very small changes 2-D profile changes that usually occur when applying subtle OPC corrections.

Interpreting the Diffracted Light in Scatterometry From Periodic Structures

In scatterometry, as light is diffracted off the grating, it needs to be properly interpreted to determine the shape of the cross-sectional line profiles within a grating. Indeed, the ability to predict the behavior of diffraction gratings with high precision is the key to understanding the diffraction grating. However, it is well known that modeling of diffraction of light by corrugated periodic structures is a complex problem that requires sophisticated techniques.

The general problem of electromagnetic diffraction from gratings has been addressed in various ways. Several rigorous theories of periodic and non-periodic diffraction gratings have been developed in the past decades. For example, a method developed by Neureuther and Zaki (see "Numerical methods for the analysis of scattering from non-planar periodic structures", Intn'l URSI Symposium of Electromagnetic Waves, Stresa, Italy, 282–285, 1969.) uses a fairly complex integral method to obtain numerical results. Another method of determining the diffraction response from periodic gratings is the differential method first proposed by Neviere and Vincent, et. al. in "Systematic study of the resonances of holographic thin film coupler", Optics Communications, vol. 9, no. 1, 48–53, Sep. 1973. A third method is called rigorous coupled-wave analysis (RCWA). Of the three, RCWA is the currently the most widely used method for the accurate analysis of the diffraction by periodic gratings. RCWA is a non-iterative, deterministic technique that uses a state-variable method for determining the numerical solution. The differential method and coupled-wave method are very close to each other in theoretical point of view, even though their numerical approaches are different.

9

What is needed is a better way of measuring and compiling a detailed 2-dimensional profile database that can be used to create better wavefront engineering solutions.

SUMMARY OF THE INVENTION

The present invention provides a method and apparatus for determining optical mask corrections for photolithography. A plurality of grating patterns is printed onto a wafer utilizing a photomask having at least one grating. Each grating pattern within the plurality of grating patterns is associated with known photolithographic settings. Each grating pattern is illuminated independently with a light source, so that light is diffracted off each grating pattern. The diffracted light is measured utilizing scatterometry techniques to determine measured diffracted values. The measured diffracted values are compared to values in a library to determine a profile match. A 2-dimensional profile description is assigned to each grating pattern based on the profile match. A database is compiled of the profile descriptions for the plurality of grating patterns. Photomask design rules are then generated by accessing the database containing the 2-dimensional profile descriptions. In preferred embodiments, the design rules are used to create and correct masks containing OPC corrections, phase-shifting mask corrections and binary masks. In a preferred embodiment the at least one grating is a bi-periodic grating. In a preferred embodiment, the scatterometry technique is optical digital profjwmetry utilizing a reflectometer or ellipsometer.

BRIEF DESCRIPTION OF THE DRAWINGS

FIG. 1 shows UV light illuminating a layer of photoresist.

FIG. 2A shows a resist profile.

FIG. 2B shows the profile of lines after etch.

FIG. 3 shows a resist profile.

10

DETAILED DESCRIPTION OF PREFERRED EMBODIMENTS

Preferred embodiments of the present invention are hereinafter described by reference to the drawings.

Printing a Wafer Utilizing a Test Mask

Figure 4:
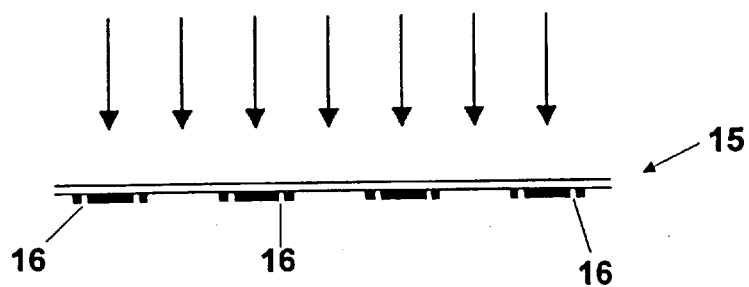
FIG. 4 shows a mask with OPC corrections.
Figure 5:
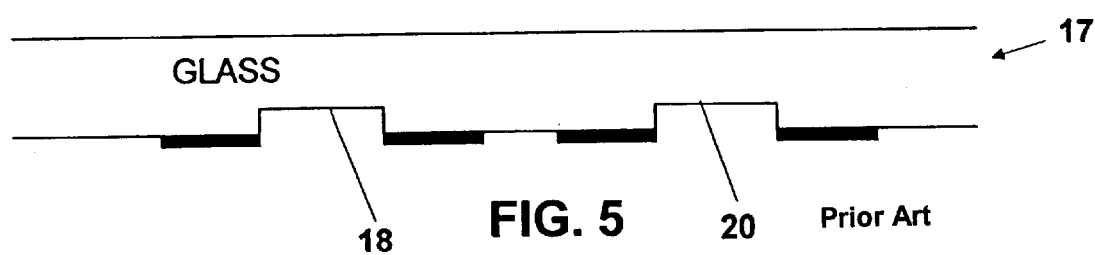
FIG. 5 shows a mask with phase-shifting mask corrections.
Figure 6:
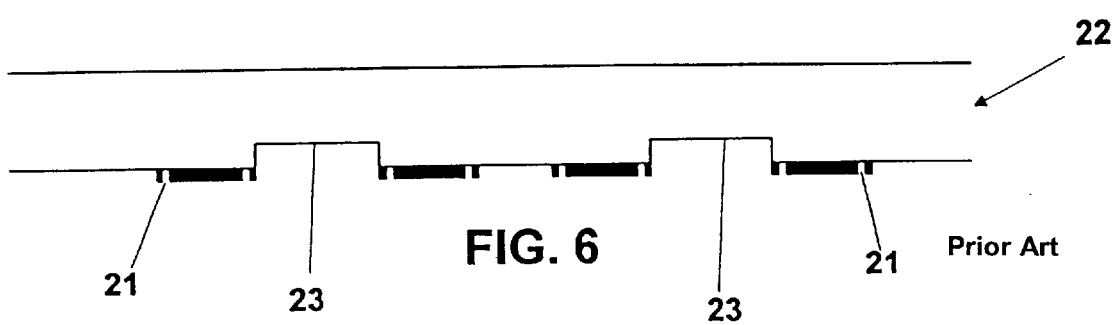
FIG. 6 shows a mask with both OPC and phase-shifting mask corrections.
Figure 7:
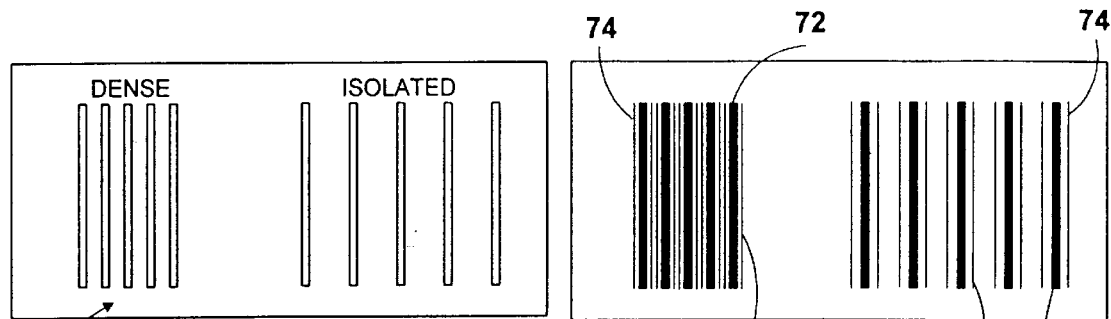
FIG. 7 shows a resist pattern.
Figure 8:
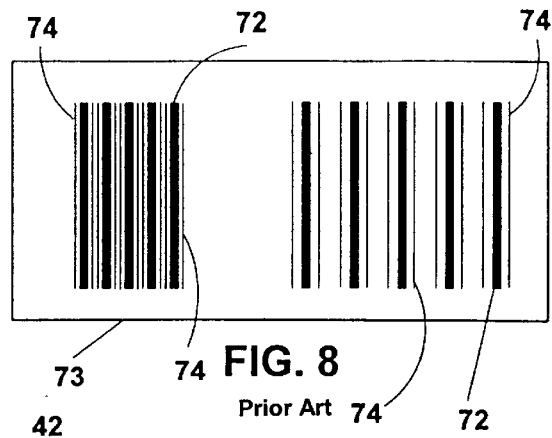
FIG. 8 shows a mask pattern.
Figure 9:
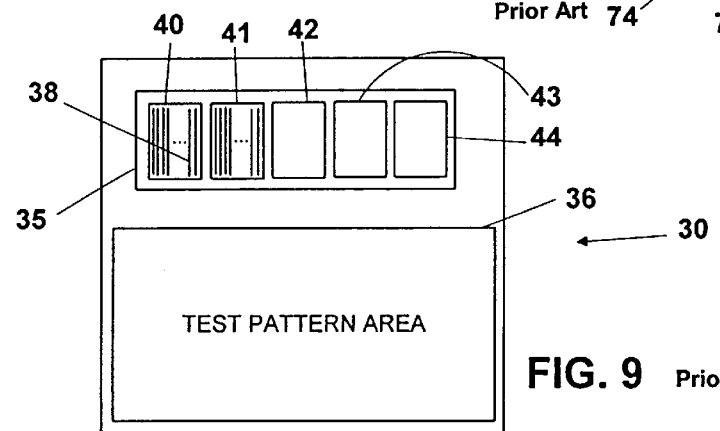
FIG. 9 shows a prior art mask.
Figure 10:
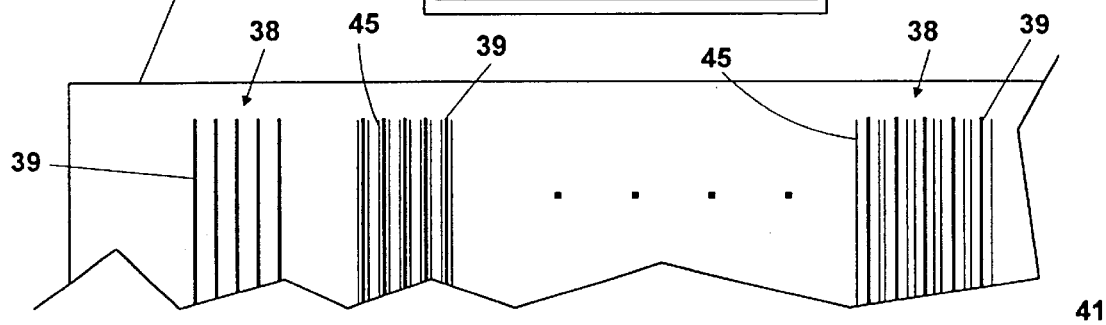
FIG. 10 shows a portion of a prior art mask.
Figure 11:
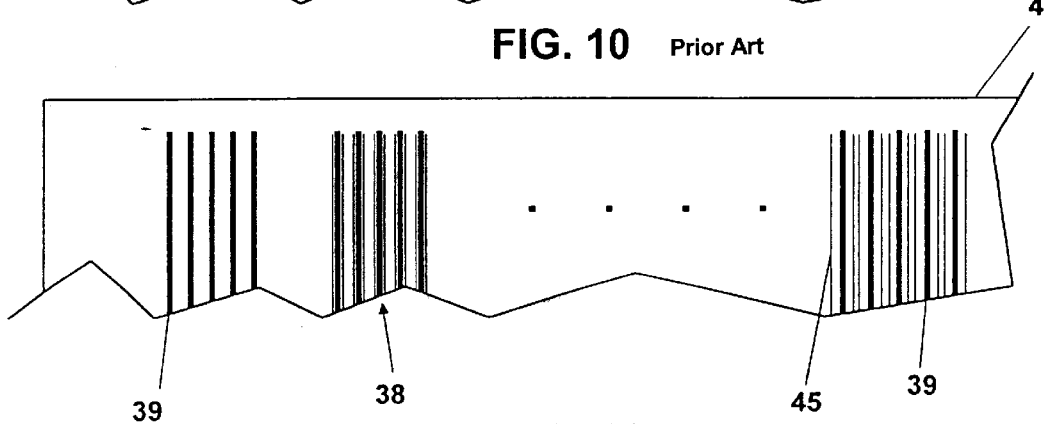
FIG. 11 shows another portion of a prior art mask.
Figure 12:
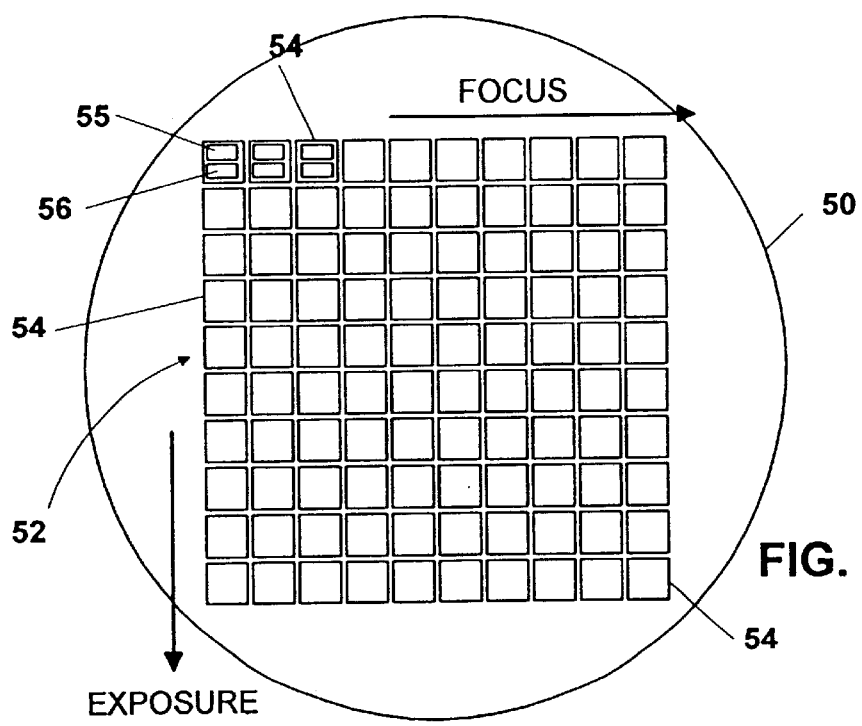
FIG. 12 shows a printed wafer
Figure 13:
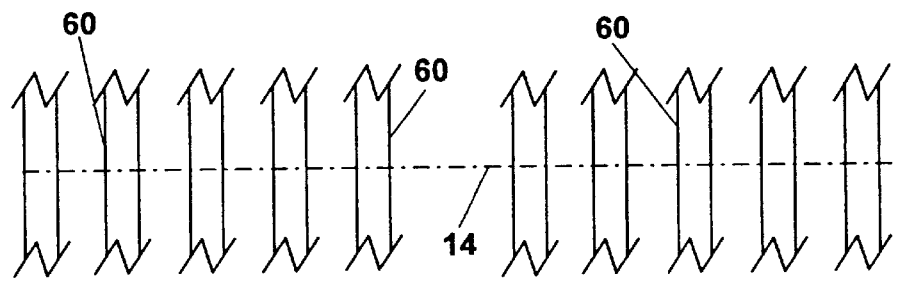
FIG. 13 shows a top view of resist lines.
Figure 14A:
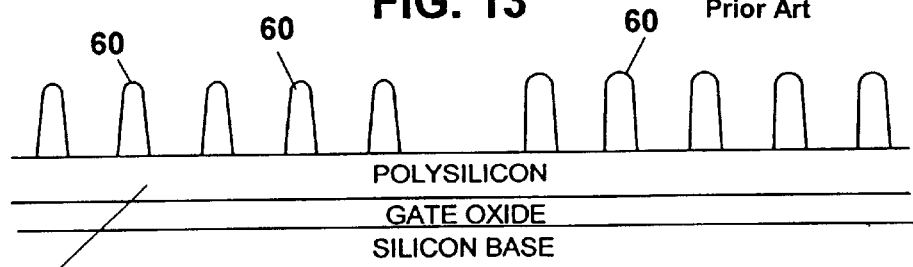
FIG. 14A shows a side view of resist lines.
Figure 14B:
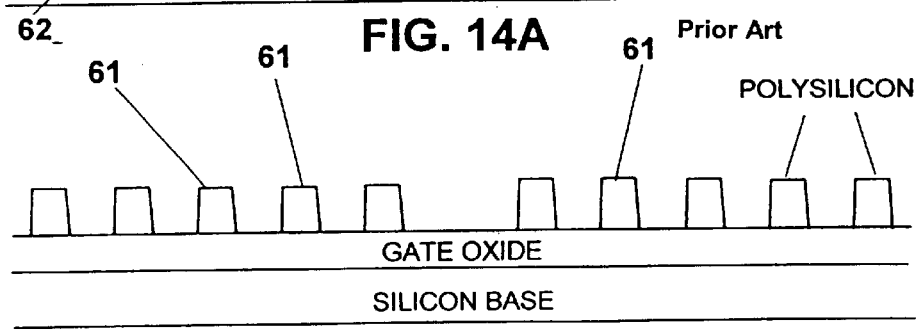
FIG. 14B shows a side view of lines after etch.
Figure 15:
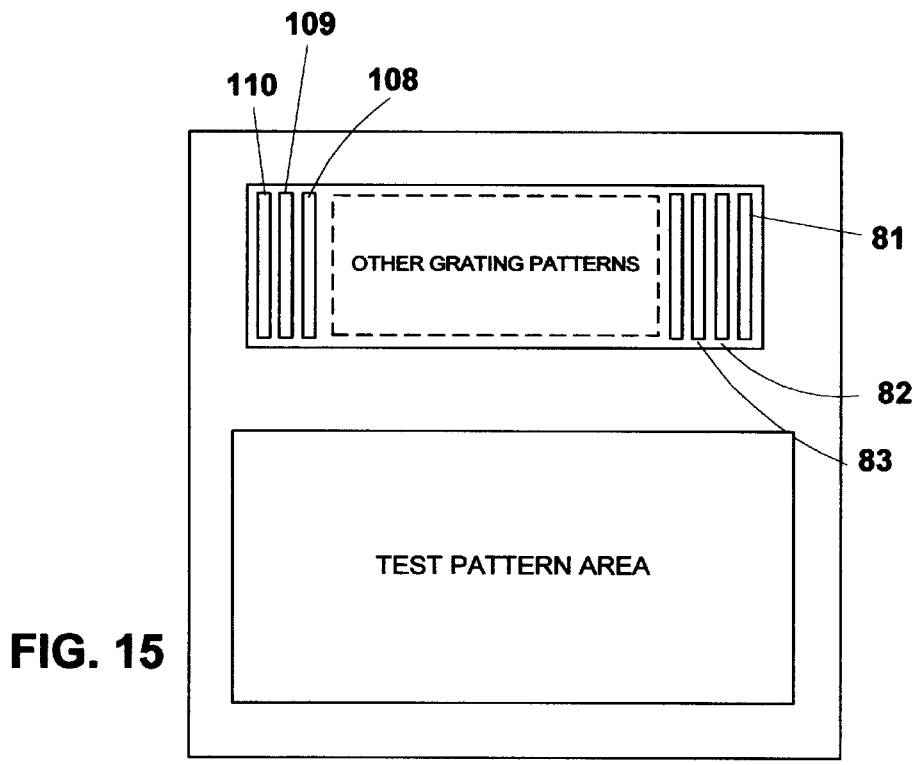
FIG. 15 shows a top view of a preferred mask with grating patterns.
Figure 16:
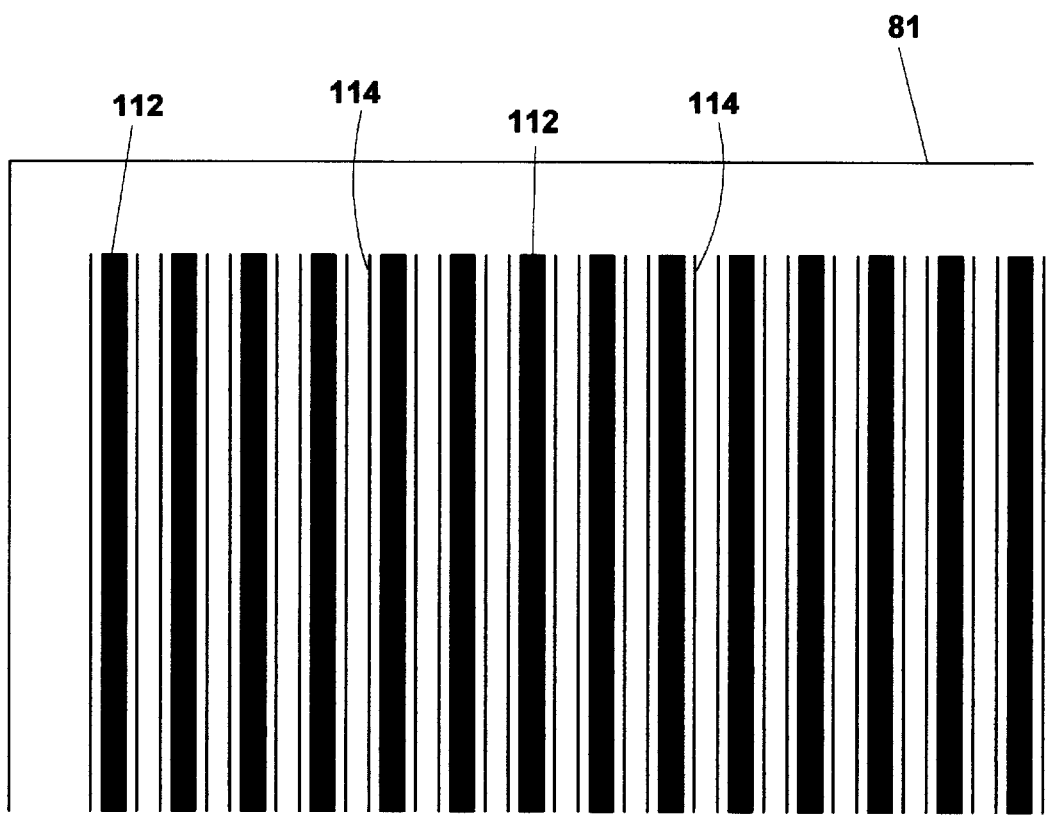
FIG. 16 shows a detailed view of a grating.

In a preferred embodiment of the present invention, a semiconductor wafer coated with photoresist is printed utilizing a photomask containing various grating arrays of periodic and/or bi-periodic structures. The wafer is printed under specific photolithographic exposure settings. Values such as focus, exposure, resist thickness, temperature, numerical aperture and partial coherence are noted and recorded. A simple version of the preferred photomask is shown in FIG. 15. It contains an array of thirty grating patterns 81–110. The lines within each grating pattern 81–110 preferably have their own unique optical corrections, such as their own unique OPC corrections or phase shift masking corrections. A small portion of a simple grating pattern 81 is shown in FIG. 16. It has 130 lines 112 that are equidistantly spaced. The grating pattern also has OPC lines 114.

Measure the Grating Patterns using an Ellipsometer

Figure 17:
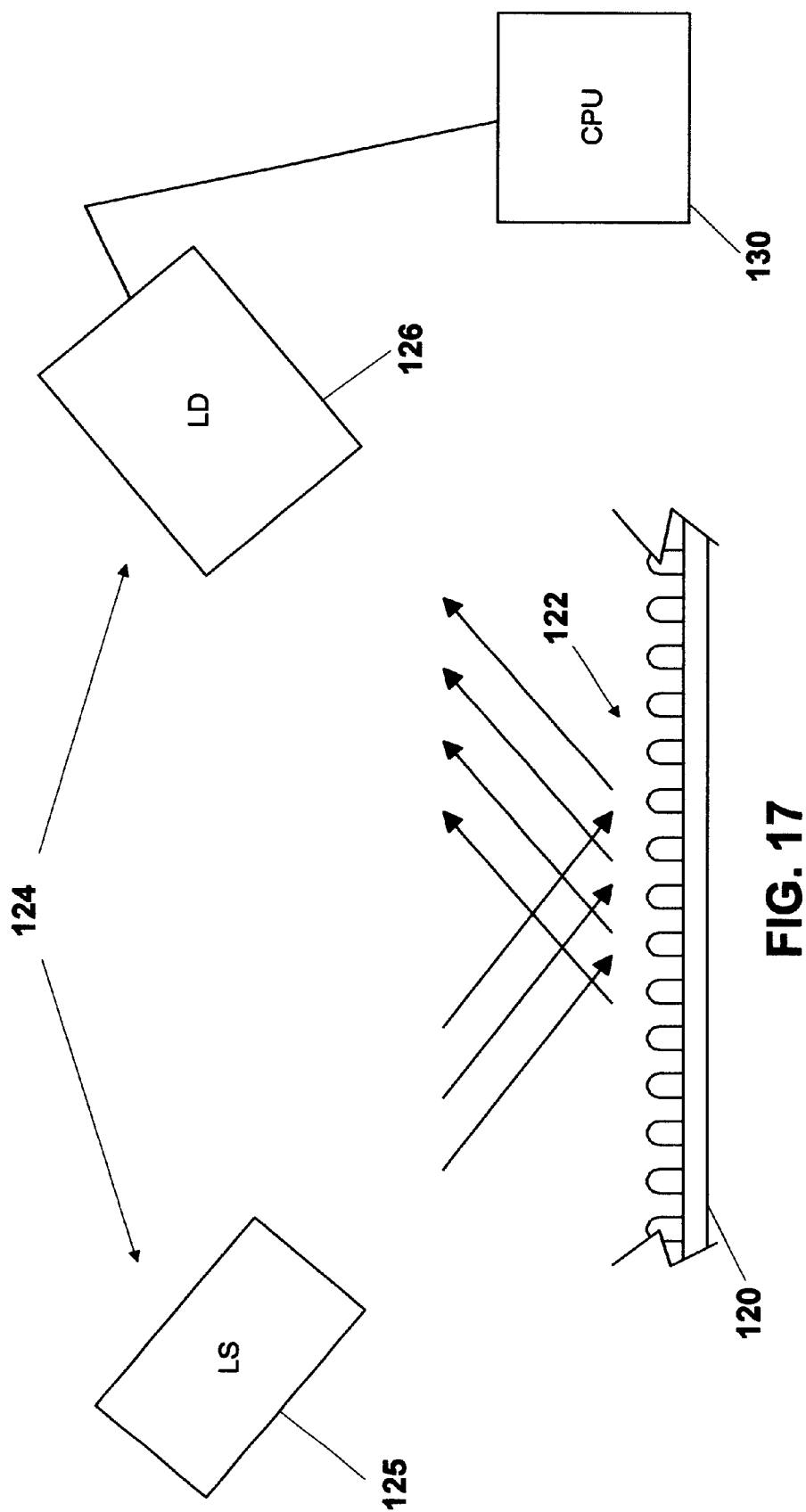
FIG. 17 shows a ellipsometer reading diffracted light off of a grating.

FIG. 17 shows printed wafer 120 with grating 122 underneath a spectroscopic ellipsometer 124, such as ellipsometer model no. F 5, available from KLA-Tencor, Inc. Grating 122 on wafer 120 corresponds to grating pattern 81 shown in FIG. 16. FIG. 16 shows a portion of the photomask shown in FIG. 15. In a preferred embodiment, broadband polarized light from light source 125 illuminates grating 122. Light is then diffracted from grating 122 and is detected and measured by light detector 126. The spectroscopic ellipsometer records tan $\Psi$ and cos $\Delta$ as a function of wavelength for grating pattern 122. The same measurements are repeated until a matrix of tan $\Psi$ and cos $\Delta$ vs. wavelength has been obtained for all patterns 81–110. The size of the grating patterns can be adjusted in such as way as to work with any ellipsometer—where the spot size of the ellipsometer is smaller than the grating size.

Using ODP to Compare Measured Values of Diffracted Light to Values in Library CPU 130, shown in FIG. 17, is programmed to receive tan $\Psi$ and cos $\Delta$ as a function of wavelength from spectroscopic ellipsometer 124 for all patterns 81–110 and enter that data into an internal database. Within CPU 130 is a scatterometry comparison library, preferably obtained by utilizing a version of RCWA. The library contains many different sets of ellipsometry data each corresponding to predetermined known grating profiles specifically defining the gratings in all dimensions of interest (such as resist thickness, optical constants of thin films, focus, exposure, OPC, etc.). CPU 130 compares the tan $\Psi$ and cos $\Delta$ of the diffracted light at each wavelength to the values in the look-up library. For the definition of tan A and cos $\Delta$, please see discussion in background section under "Ellipsometry".

Assign a 2-D Profile to a Grating

A 2-D profile is then assigned to each grating when there is a match between the measured values of the diffracted light to the values in the library. Well known mathematical convergence techniques are preferably employed for seeking the best match. The 2-D profile consists of enough information to define the grating (i.e., feature profile shape and pitch). A simulated annealing optimization routine such as described in Xinhui Niu, et. al., "Specular Spectroscopic Scatterometry in DUV Lithography", *Metrolozy, Inspection, and Process Control for Microlithograiphy XIII*, Vol. 3677, pp. 159–168, 1999 may also be used in making the match.

Compile a Database of Profiles

CPU 130 is then programmed to compile a database of profiles. The database has profiles that vary from one another based on the lithographic and etch settings at the time of printing or imaging (i.e., focus, exposure, resist thickness, temperature, numerical aperture and partial coherence, OPC correction). This database can be made very large by creating a large number of gratings (such as grating 122) with various combinations of focus, exposure, resist thickness, etc. By utilizing the profile database, it can be determined what the grating profile will look like for a given type of OPC and/or wavefront corrections and other lithographic conditions and settings.

Rules are then Compiled

In a preferred embodiment, rules are then compiled using an OPC analysis routine (such as those techniques used by ASML MaskTools, Inc. and implemented in the MASKRIGGER software package). These rules may be similar to the rules described above in the background section under the heading "Compiling the Rules". However, unlike in the prior art that typically requires a cross-section CD-SEM analysis, by utilization of the present invention, the user saves considerable time and expense in determining the rules. Typically, whereas it might take three or four weeks to get the results using the CD-SEM analysis, this technique could shorten this time to a matter of hours.

Second Preferred Embodiment

Figure 18:
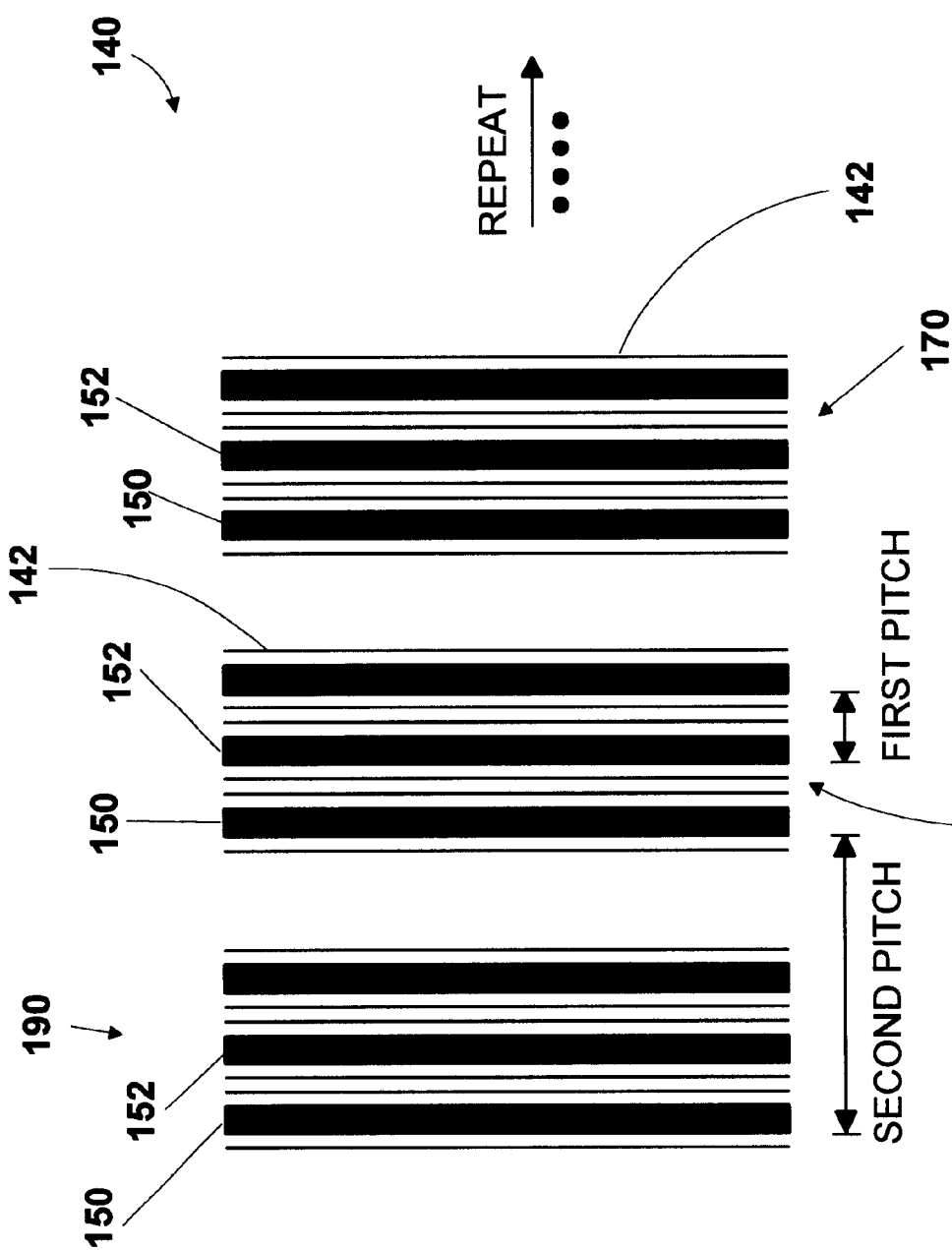
FIG. 18 shows a bi-periodic grating.

A second preferred embodiment is shown by reference to FIG. 18. In the second preferred embodiment grating patterns 81 through 110 are replaced by bi-periodic grating patterns. Bi-periodic grating pattern 140 with OPC correction lines 142 is shown in FIG. 18. Bi-periodic grating pattern 140 is referred to as being a bi-periodic grating because there are two repeating pitches throughout the grating. The first pitch refers to the pitch distance between adjacent lines within each group 170, 180 and 190. The second pitch refers to the pitch distance between adjacent groups. Applicants have shown through simulation that by diffracting light off gratings created by a bi-periodic grating pattern, the user can better ascertain the profile of each line within the group if the scatterometry library is created using the robust RCWA technique implemented in the ODP technique described in the background section. For example, in groups 170, 180 and 190 there is a first line 150. This line is an end line and it has been verified experimentally and in simulation that on average the end lines tend to have a different profile than, for example, a middle line such as lines 152. This is due to the fact that isolated and dense lines print differently as mentioned earlier. It is useful to the optical scientist or process engineer to know the profile of each line within the repeating group as opposed to obtaining average information using conventional scatterometry. The bi-periodic grating stands in contrast to grating pattern 81 shown in FIG. 16. By utilization of grating pattern 81, the user is only able to ascertain the average profile shape across the entire grating. In the second preferred embodiment, one uses ODP scatterometry allows one to determine the 2 dimensional profile information of each line in the repeating group.

Figure 19:
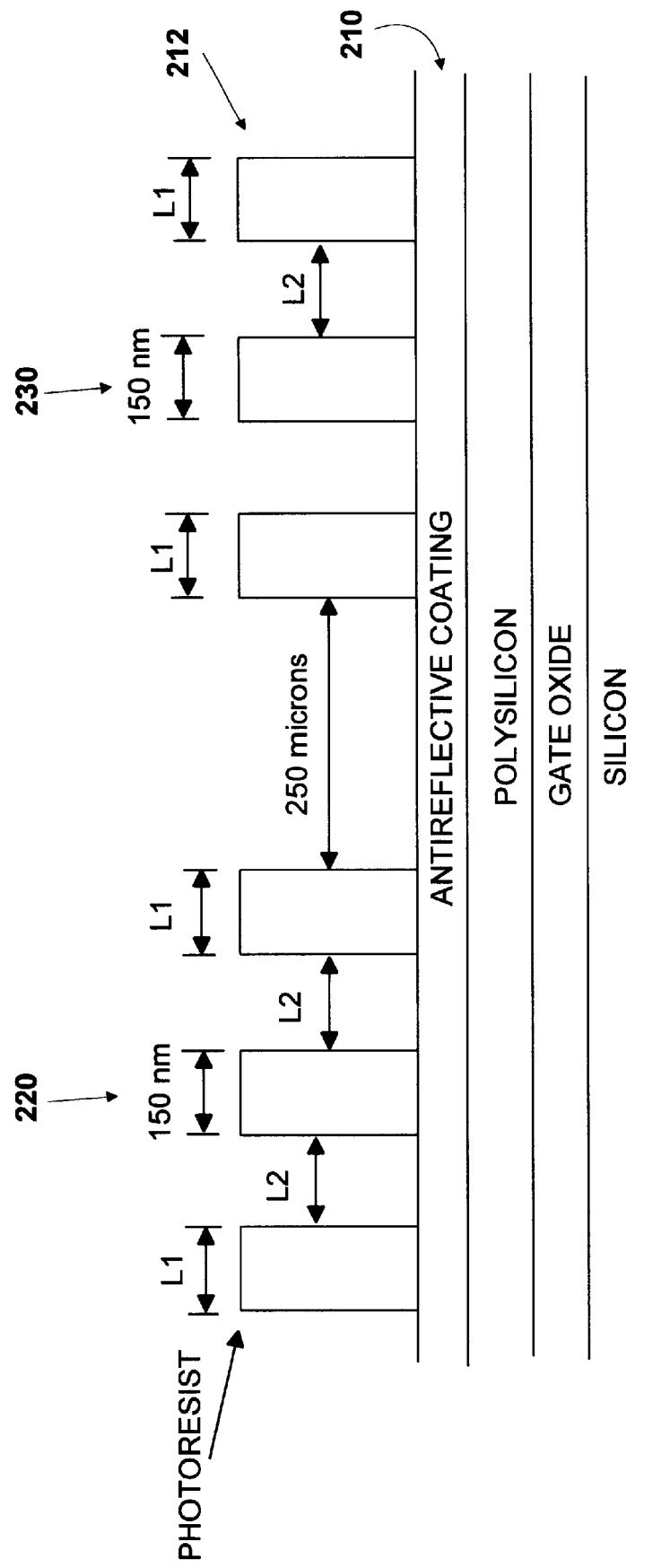
FIG. 19 shows a side view bi-periodic of resist lines.
Figure 20:
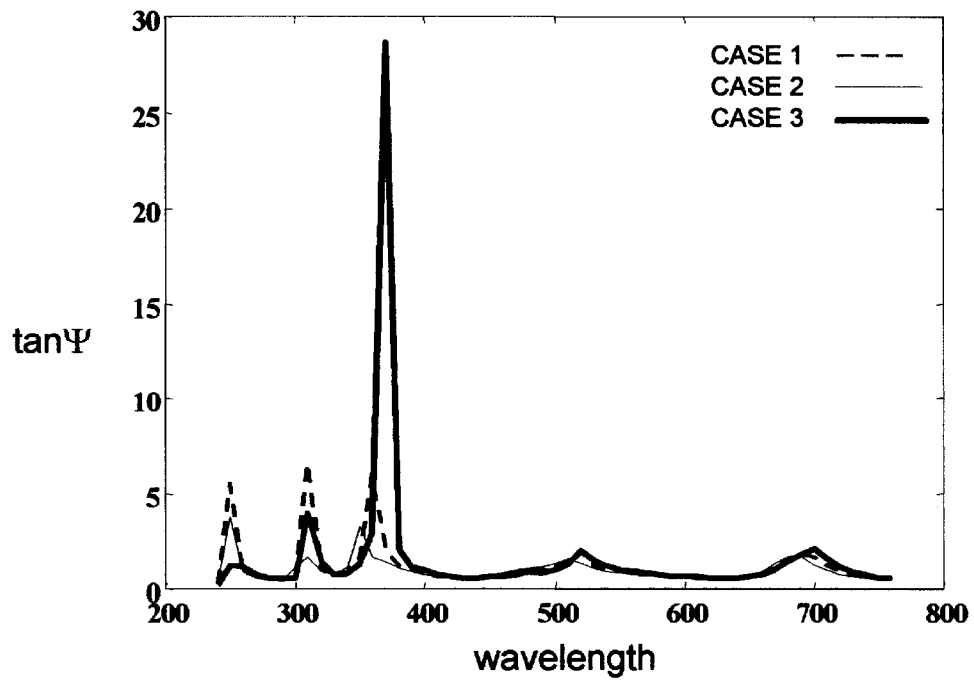
FIG. 20 is a graph showing tan $\Psi$ vs. wavelength for bi-periodic stuctures using ODP.
Figure 21:
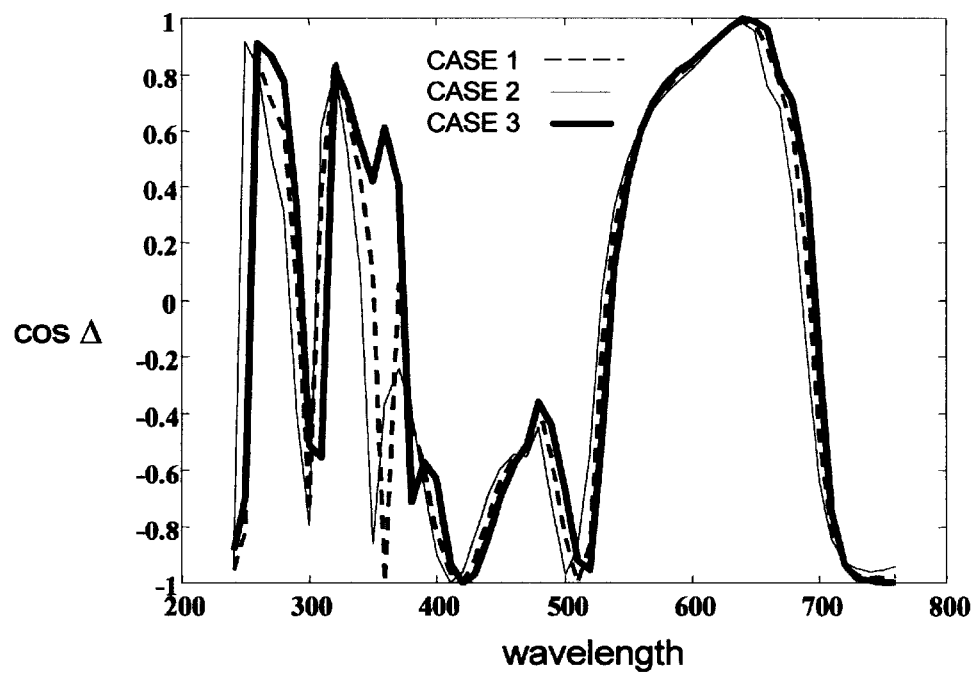
FIG. 21 is a graph showing cos $\Delta$ vs. wavelength for bi-periodic structures using ODP.

A simulation showing that it is possible to determine very small differences in individual line shape is by reference to FIGS. 19–21.

FIG. 19 shows resist profile 212 on an anti-reflective coating 210. Resist profile 212 is representative of a profile that would be created using a mask having the bi-periodic grating shown in FIG. 18. L1 represents the linewidth of the end resist lines and L2 represents the distance between each resist line within groups 220 and 230. The center line of each group is fixed at 150 nm. The distance between group 220 and group 230 is 250 microns. Table 1 shows the parameters for three simulated cases conducted by Applicants.

TABLE 1

| Case Number | L1 (nm) | L2 (nm) |
|---|---|---|
| 1 | 150 | 150 |
| 2 | 140 | 160 |
| 3 | 160 | 140 |

For each case, the distance between group 220 and group 230 was set at 250 microns. The values for L1 and and L2 were varied as shown in Table 1. FIG. 20 shows a graph of tan $\Psi$ vs. wavelength for each case and FIG. 21 shows a graph of cos $\Delta$ vs. wavelength for each case. As can be seen by reference to FIGS. 21 and 22, despite just small variations in L1 and L2, significant changes were seen in the plots representing tan $\Psi$ and cos $\Delta$ as a function of wavelength. Hence, because of the sensitivity demonstrated by this simulation, it can be seen that the utilization of bi-periodic gratings in conjunction with ODP scatterometry is a very valuable tool for determining 2-D profile of individual lines within grating structures.

Other Gratings with Repeating Features

Figure 23:
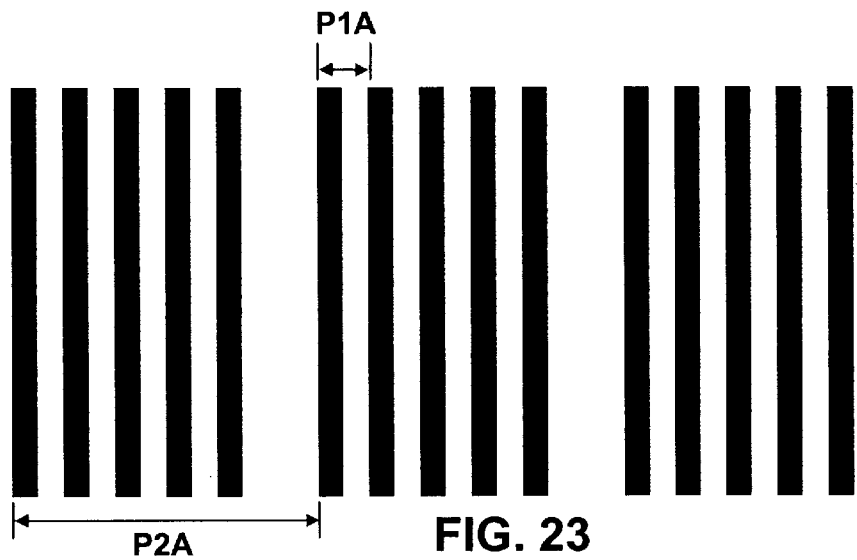
FIGS. 23–25 show top views of gratings having multiple repeating features.
Figure 24:
Figure 25:
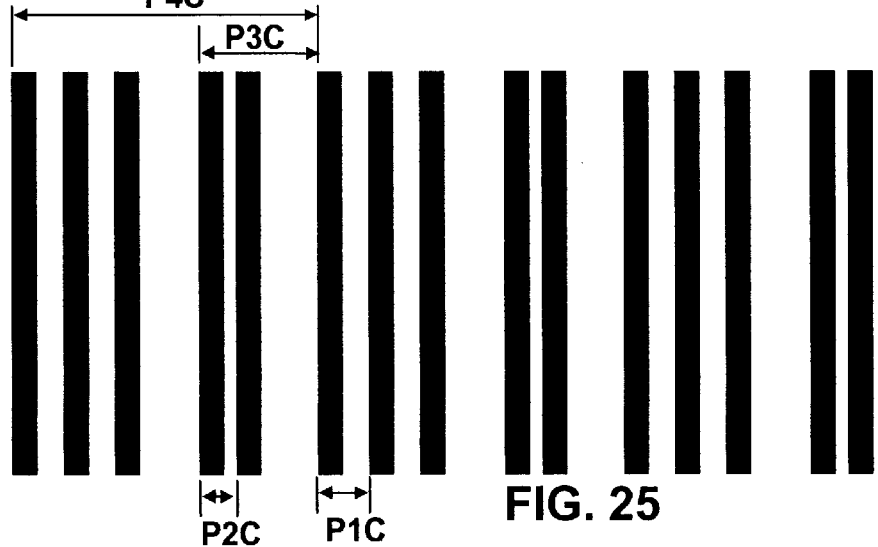

A simple grating is shown in FIG. 16 and is discussed above. It was shown in the discussion covering bi-periodic gratings that more detailed information regarding the characteristics of individual lines can be determined by the utilization of a bi-periodic grating. FIG. 18 showed a mask grating with two repeating features (i.e., the first pitch repeats and the second pitch repeats. It is also possible to make grating masks with multiple repeating features other than that shown in FIG. 18. For example, FIG. 23 shows a bi-periodic mask where pitch 1A (P1A) and pitch 2A (P2A) repeat. This mask is similar to the mask shown in FIG. 18 except that there are 5 lines in each group rather than 3. FIG. 24 shows a mask with multiple repeating features pitch 1B (P1B), pitch 2B (P2B) and pitch 3B (P3B). Likewise, FIG. 25 shows a mask with multiple repeating features pitch 1C (P1C), pitch 2C (P2C), pitch 3C (P3C), and pitch 4C (P4C). By utilizing a mask with multiple repeating features such as those shown in FIGS. 18, 23, 24 or 25, it is possible to obtain more detailed information about individual lines within a grating including isolated line performance as shown in FIG. 24.

Figure 22:
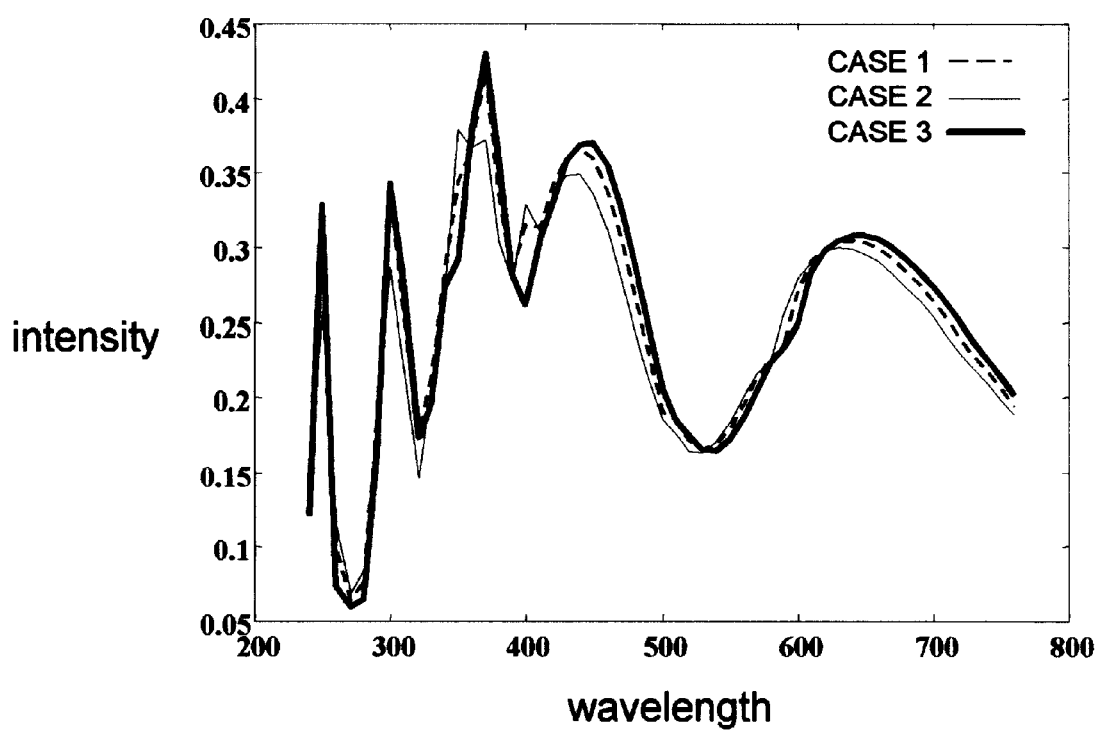
FIG. 22 is a graph showing intensity vs. wavelength for reflectance simulation using ODP for bi-periodic features.

While the above description contains many specifications, the reader should not construe these as limitations on the scope of the invention, but merely as exemplifications of preferred embodiments thereof. Those skilled in the art will envision many other possible variations are within its scope. For example, although Optical Digital Profilometry was described in the preferred embodiments as a method that uses a spectroscopic ellipsometer, ODP can also work with a spectroscopic reflectometer or other optical technique that produces intensity and/or phase information as a finction of wavelength, angle and degree of polarization. For example, FIG. 22 shows a graph of intensity vs. wavelength for a reflectance simulation using ODP for bi-periodic features. The L1 and L2 values for case 1, 2 and 3 are the same as shown in FIG. 1. Also, one of ordinary skill in the art will recognize that the methods of the preferred embodiment could be used to measure the CDs of the lines on photomasks and other periodic diffraction gratings as well. Also, although FIGS. 18, 23, 24 and 25 showed specific gratings with multiple repeating features, one of ordinary skill in the art would recognize that there are many other variations of gratings that are possible. For example, the bi-periodic grating shown in FIG. 23 could be modified so that there are seven or six lines in each group rather than five (FIG. 23) or three (FIG. 18). Also, although the preferred embodiments discuss how the ellipsometer records tan Ψ and cos Δ, one of ordinary skill in the art will recognize that other information equivalent to tan Ψ and cos Δ can be recorded, such as generalized Stokes parameters. Accordingly the reader is requested to determine the scope of the invention by the appended claims and their legal equivalents, and not by the examples that have been given.

We claim:

1. A method of determining optical mask corrections for photolithography, comprising the steps of:
   A. printing a plurality of grating patterns onto a wafer utilizing a mask comprising at least one grating, wherein each grating pattern within said plurality of grating patterns is associated with known photolithographic settings,
   B. illuminating independently said each grating pattern with a light source, so that light is diffracted off said each grating pattern,
   C. measuring said diffracted light utilizing scatterometry techniques to determine measured diffracted values,
   D. comparing said measured diffracted values to values in a library to determine a profile match,
   E. assigning a profile description to said each grating pattern based on said profile match,
   F. compiling a database of said profile descriptions for said plurality of grating patterns, and
   G. generating a set of rules by accessing said database of said profile description, wherein said rules are for mask design and correction.

2. The method as in claim 1, wherein said at least one grating is at least one bi-periodic grating.

3. The method as in claim 1, wherein said scatterometry technique is optical digital profilometry.

4. The method as in claim 1, wherein said scatterometry technique is spectroscopic reflectance scatterometry.

5. The method as in claim 1, wherein said library is compiled utilizing a modified version of RCWA.

6. The method as in claim 1, wherein said at least one grating is a grating comprising multiple repeating features.

7. An apparatus for determining optical mask corrections for photolithography, comprising:
   A. a printing means for printing a plurality of grating patterns onto a wafer utilizing a mask comprising at least one grating, wherein each grating pattern within said plurality of grating patterns is associated with known photolithographic settings,
   B. an illuminating means for illuminating independently said each grating pattern with a light source, so that light is diffracted off said each grating pattern,
   C. a measuring means for measuring said diffracted light utilizing scatterometry techniques to determine measured diffracted values,
   D. a comparing means for comparing said measured diffracted values to values in a library to determine a profile match,
   E. an assigning means for assigning a profile description to said each grating pattern based on said profile match,
   F. a compiling means for compiling a database of said profile descriptions for said plurality of grating patterns, and
   G. a generating means for generating a set of rules by accessing said database of said profile description, wherein said rules are for mask design and correction.

8. The apparatus as in claim 7, wherein said at least one grating is at least one bi-periodic grating.

9. The apparatus as in claim 7, wherein said scatterometry technique is optical digital profilometry.

10. The apparatus as in claim 7, wherein said scatterometry technique is spectroscopic reflectance scatterometry.

11. The apparatus as in claim 7, wherein said library is compiled utilizing a modified version of RCWA.

12. The apparatus as in claim 7, wherein said at least one grating is a grating comprising multiple repeating features.

13. An apparatus for determining optical mask corrections for photolithography, comprising:

a light source configured to illuminate a plurality of grating patterns formed on a wafer so that light is diffracted off of the grating pattern;

a light detector configured to measure the diffracted light; and a processor configured to:
      compare the measured diffracted light to a library of diffracted light values to determine a profile match for each of the plurality of grating patterns,
      assign a profile description to each of the plurality of grating patterns based on the profile match,
      compile a database of profile descriptions of the plurality of grating patterns, and
      generate a set of rules for mask design and correction based on the database of profile descriptions.

14. The apparatus of claim 13, wherein each grating pattern within the plurality of grating patterns is associated with known photolithographic settings used to form the grating pattern on the wafer.

15. The apparatus of claim 14, wherein the plurality of grating patterns having varying optical corrections.

16. The apparatus of claim 13, wherein the library of diffracted light values comprises sets of ellipsometry data corresponding to predetermined known grating profiles.

17. The apparatus of claim 16, wherein the library of diffracted light values is compiled utilizing a version of Rigorous Coupled-Wave Analysis (RCWA).

18. The apparatus of claim 13, wherein the plurality of grating patterns includes a bi-periodic grating.

19. The apparatus of claim 13, wherein the diffracted light is measured using optical digital profilometry.

20. The apparatus of claim 13, wherein the diffracted light is measured using spectroscopic reflectance scatterometry.

* * * * *